United States Patent
Zeng et al.

(10) Patent No.: US 8,583,979 B1
(45) Date of Patent: Nov. 12, 2013

(54) MULTIPLE INTERLEAVERS IN A CODING SYSTEM

(75) Inventors: Lingqi Zeng, San Jose, CA (US); Yu Kou, San Jose, CA (US); Kin Man Ng, Cupertino, CA (US)

(73) Assignee: SK hynix memory solutions inc., San Jose, CA (US)

( * ) Notice: Subject to any disclaimer, the term of this patent is extended or adjusted under 35 U.S.C. 154(b) by 703 days.

(21) Appl. No.: 12/454,558

(22) Filed: May 19, 2009

Related U.S. Application Data

(60) Provisional application No. 61/196,459, filed on Oct. 17, 2008.

(51) Int. Cl.
*H03M 13/00* (2006.01)
(52) U.S. Cl.
USPC .......................................................... 714/752
(58) Field of Classification Search
USPC .......................................................... 714/752
See application file for complete search history.

(56) References Cited

U.S. PATENT DOCUMENTS

| | | | | |
|---|---|---|---|---|
| 6,014,411 | A * | 1/2000 | Wang | 375/259 |
| 6,112,324 | A * | 8/2000 | Howe et al. | 714/763 |
| 6,148,428 | A * | 11/2000 | Welch et al. | 714/752 |
| 6,480,475 | B1 * | 11/2002 | Modlin et al. | 370/294 |
| 6,959,412 | B2 * | 10/2005 | Silvus et al. | 714/778 |
| 2001/0052098 | A1 * | 12/2001 | Miyauchi et al. | 714/746 |
| 2002/0029362 | A1 * | 3/2002 | Stephen et al. | 714/752 |
| 2008/0276156 | A1 | 11/2008 | Gunnam et al. | |
| 2008/0301521 | A1 | 12/2008 | Gunnam et al. | |
| 2010/0246664 | A1 * | 9/2010 | Citta et al. | 375/240.01 |
| 2011/0026601 | A1 * | 2/2011 | Mueller et al. | 375/240.24 |

* cited by examiner

*Primary Examiner* — Shelly A Chase
*Assistant Examiner* — Enam Ahmed
(74) *Attorney, Agent, or Firm* — Van Pelt, Yi & James LLP

(57) ABSTRACT

A technique for processing data. The technique includes modulation encoding input data. A first interleaving process is used to obtain first interleaved data. The first interleaved data is systematically encoded. The systematically encoded data is interleaved using a second interleaving process to obtain second interleaved data. The second interleaving process is an inverse of the first interleaving process, at least for a common portion.

24 Claims, 9 Drawing Sheets

MULTIPLE INTERLEAVERS IN A CODING SYSTEM

CROSS REFERENCE TO OTHER APPLICATIONS

This application claims priority to U.S. Provisional Patent Application No. 61/196,459 entitled MULTIPLE INTERLEAVERS IN A REVERSE CONCATENATION SYSTEM filed Oct. 17, 2008 which is incorporated herein by reference for all purposes.

BACKGROUND OF THE INVENTION

One type of telecommunication or digital storage systems is a reverse concatenation system. In one example of a reverse concatenation system, a transmitter or write processor includes a modulation encoder, an error correction encoder (or, more generally, a systematic encoder), and a parity encoder. A corresponding receiver or read processor includes a parity decoder, an error correction decoder (or, more generally, a systematic decoder), and a modulation decoder. It would be desirable to develop new systems and techniques that improve the performance of reverse concatenation and other systems.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1A:
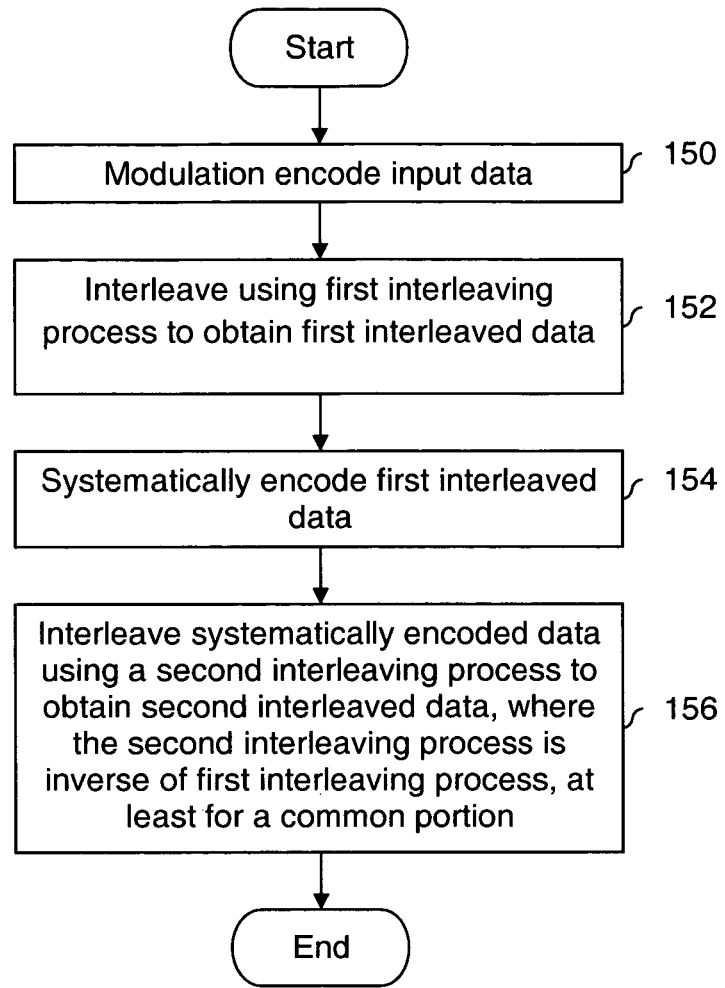
FIG. 1A is a flowchart illustrating an embodiment of a process for operating on data performed a transmitter or a write processor.

FIG. 1A is a flowchart illustrating an embodiment of a process for operating on data performed a transmitter or a write processor. At 150, input data is modulation encoded. In one example, the modulation performed is a run-length-limited (RLL) code. In some embodiments, the modulation code is selected for its abilities or performance for a particular channel behavior or response. At 152, interleaving is performed using a first interleaving process to obtain first interleaved data. In some embodiments, the modulation encoded data generated by step 150 is passed directly to an interleaver and is interleaved. In some embodiments, one or more intermediary processes are performed after modulation encoding at step 150 and before interleaving at step 152. These processes should not affect the modulation constraint embedded by modulation encoding.

The first interleaved data is systematically encoded at 154. In various embodiments, the systematic coding includes error detection coding or error correction coding. The systematically encoded data is interleaved using a second interleaving process to obtain second interleaved data at 156, where the second interleaving process is the inverse of the first interleaving process, at least for a common portion. For example, the length of the second interleaving process is longer than that of the first interleaving process (because systematic encoding introduces redundant parity symbols) and the common portion (corresponding to the length of the first, shorter interleaving process) is processed using inverse reorderings.

Figure 1B:
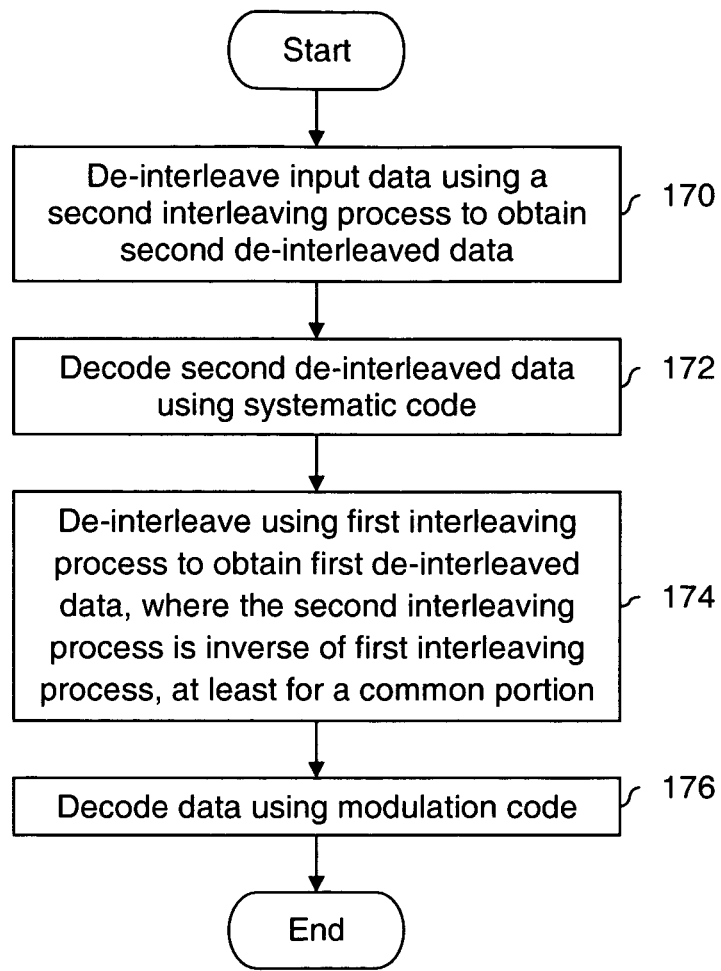
FIG. 1B is a flowchart illustrating an embodiment of an inverse process for operating on data performed by a receiver or a read processor.

FIG. 1B is a flowchart illustrating an embodiment of an inverse process for operating on data performed by a receiver or a read processor.

At 170, input data is de-interleaved using a second interleaving process to obtain second de-interleaved data. The second de-interleaved data is decoded using a systematic code at 172. For example, based on redundant parity symbols introduced at the transmitter by a systematic encoder, some of the payload may be corrected in embodiments where the systematic code is an error correction code. After decoding, the redundant parity symbols will be removed at step 172. That is, the length of received data at step 172 is longer than the length of the output from step 172.

At 174, de-interleaving is performed using a first interleaving process to obtain first de-interleaved data, where the second interleaving process is the inverse of the first interleaving process, at least for a common portion. Data is decoded using a modulation code at 176. For example, the information may have originally been encoding using an RLL code and the inverse process is performed at step 176. In some embodiments, the data decoded at step 176 is the de-interleaved data output by step 174. In some embodiments there is some intermediate processing performed between de-interleaving at step 174 and decoding at step 176.

Figure 1C:
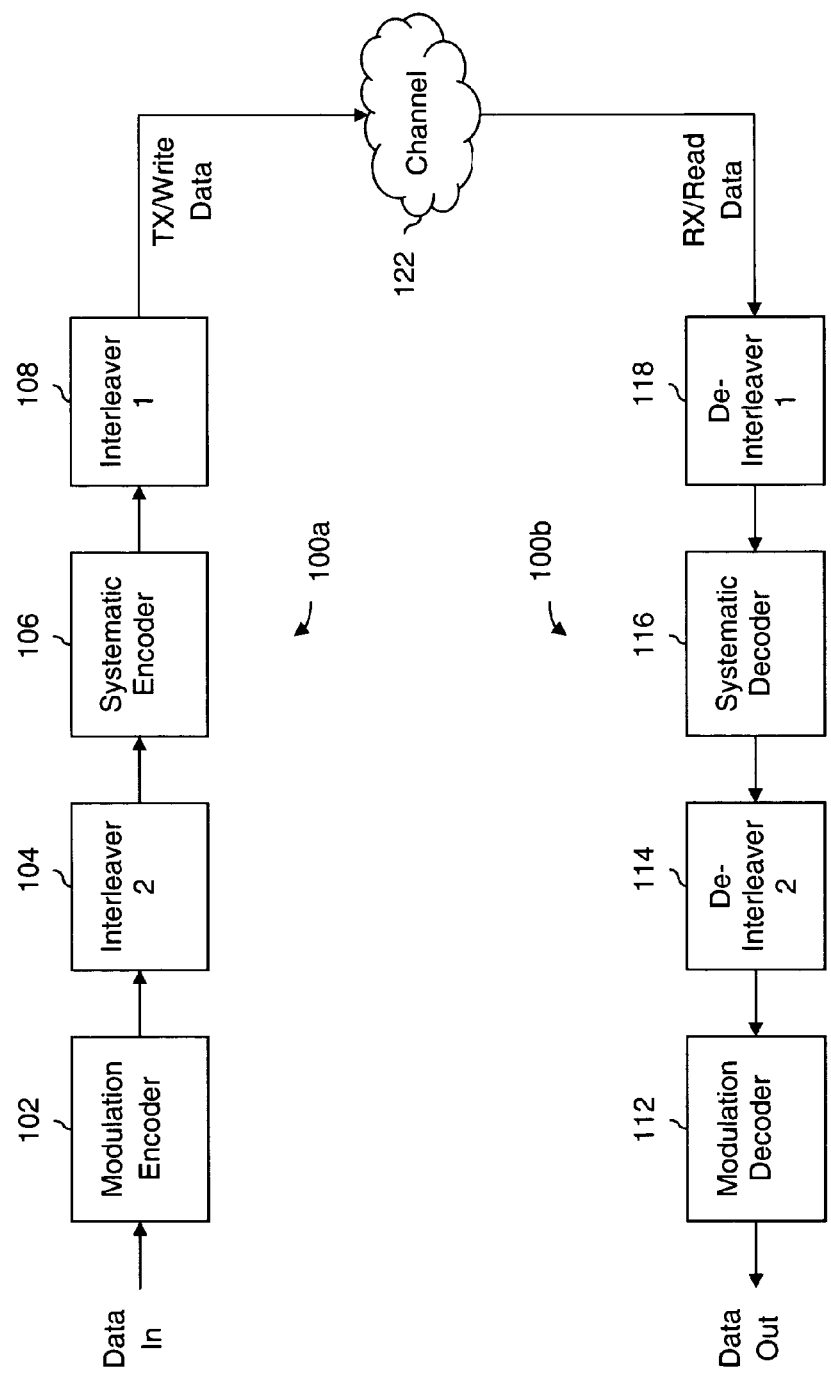
FIG. 1C is a system diagram showing an embodiment of counterpart devices, each with two interleavers.

FIG. 1C is a system diagram showing an embodiment of counterpart devices, each with two interleavers. In various embodiments, device 100a is a transmitter or a write processor and device 100b is a receiver or a read processor. Devices 100a and 100b each include two interleavers; in some other embodiments some other number of interleavers is used. In various embodiments, devices 100a and 100b are included in a variety of systems including (for example) storage systems (such as hard disk drive storage systems or Flash storage systems) or wireless or wire-line communications systems (such as IEEE 802.11).

Data in is passed to modulation encoder 102. In various embodiments, a modulation encoder performs run-length-limited (RLL) coding, maximum-transition-run (MTR) coding, or DC constraint coding. In some embodiments, a modulation encoder is used to constrain user data in order to improve the detection capability. For example, the RLL codes are employed to improve the timing and gain control, while MTR codes impose constraints to eliminate vulnerable error events. For example, if the user data contains a long, repeated pattern of "01" such as "010101010101010" then the detector will tend to make errors during this period. Adding MTR constraints can remove such patterns.

The modulation encoded data is passed from modulation encoder 102 to interleaver 2 (104). An interleaver, in general, reorders data passed to it and outputs the data in a difference sequence or order; the amount of data (e.g., in bytes) coming in matches the amount of data coming out.

The interleaved data is passed from interleaver 2 (104) to systematic encoder 106. A systematic encoder appends the parity symbols at the beginning or the end of the original input data in the encoded output. For example, some systematic encoders output the input data passed to it, followed by some parity symbols appended to the end.

In some embodiments, systematic encoder 106 uses an error correcting code or an error detection code. Some examples of error correcting codes include Reed-Solomon (RS) codes, Bose-Chaudhuri-Hocquenghem (BCH) codes, low-density parity-check (LDPC) codes, convolutional codes, turbo codes, etc. In some applications, the channel is noisy and error correcting codes or error detection codes enable the user data to be exchanged in a more reliable manner.

Systematic encoder 106 is coupled to interleaver 1 (108). Interleaver 1 (108) is longer than interleaver 2 (104) because of the parity symbols introduced by systematic encoder 106. Interleaver 1 (108) and interleaver 2 (104) perform inverse functions of each other for a common portion. For example, suppose interleaver 2 (104) has a length of X and systematic encoder 106 introduces an extra Y amount of data. For the common X amount of information, interleaver 1 (108) performs the inverse operation of interleaver 2 (104). Interleaving of the remaining Y amount of data by interleaver 1 (108) is not necessarily constrained by interleaver 2 (104).

The data output by interleaver 108 is written to or transmitted via channel 122. For example, in a wireless communications application, channel 122 is the wireless channel and the data is transmitted via the wireless channel. In a storage application, channel 122 is storage media (such as a hard disk drive or Flash) and the data is written to the storage media.

In some embodiments, parity encoding is performed prior to being transmitted on channel 122. In those embodiments, a receiver or a read processor includes a corresponding parity decoder. In some such embodiments, a parity encoder is a systematic encoder.

Data is received or read from channel 122 and is passed to the deinterleaver 118. De-interleaver 1 (118) is the same length as interleaver 1 (108) and performs the inverse of that interleaver. After de-interleaving, the data is decoded by systematic decoder 116. For example, if the systematic code is an error correction code, error correction is performed on the payload data and the parity symbols are removed. Systematic decoder 116 is in turn coupled to de-interleaver 2 (114). After de-interleaving by de-interleaver 2 (114) by performing the inverse reorder of interleaver 2 (104), the data is passed to modulation decoder 112. After modulation decoding, the data is output.

In the example shown, the components of device 100b perform the inverse or converse operations of their counterpart in device 100a. In various embodiments, devices 100a and 100b are implemented in a variety of ways. In some embodiments, a component includes a (transmitter/write) component and its counterpart (receiver/read) component. For example, some systems do not read/write or transmit/receive at the same time. In some such applications, it is possible to share components so that a single component is used to implement (as an example) both interleaver 2 (104) and de-interleaver 1 (118). Note that since interleaver 1 (108) performs the inverse function of interleaver 2 (104) at least for a common portion and de-interleaver 1 (118) performs the inverse function of interleaver 1 (108), de-interleaver 1 (118) and interleaver 2 (104) perform the same reordering, at least for the portion in common. Similarly, other components shown in this figure in some embodiments are implemented as a single or shared component.

In some embodiments, the system shown herein includes other components that perform additional processing. For example, in some embodiments, there is a component between interleaver 2 (104) and systematic encoder 106.

The interleavers offer a number of advantages compared to a system without the interleavers. To illustrate, consider an example where systematic encoder 106 performs LDPC coding. LDPC codes are a type of ECC code that achieves close to channel capacity. However, the correction performance of an LDPC code is weakened if there are bunches of burst errors, which is not uncommon in a storage system. Interleaver 1 (108) and de-interleaver 1 (118) are used to permute the order of a data sequence and are employed to break any burst errors into random errors such that the LDPC code has better error correction performance. In other words, an LDPC code does not perform optimally if bunches of burst errors occur; it is a "weakness" of the code. Interleaver 1 (108) and de-interleaver 1 (118) prevent bunches of burst error from being received by systematic decoder 116 by permuting or otherwise changing the sequence of data prior to decoding by systematic decoder 116. There is less likelihood for bunches of burst errors in the data processed by systematic decoder 116 (i.e., the LDPC code in this example) and the LDPC code will have better performance operating on the de-interleaved data.

Interleaver 2 (104) and interleaver 1 (108) are used to ensure that modulation constraint imposed on user data by modulation encoder 102 remains untouched before sending the output of interleaver 1 (108) over channel 122. For example, the code used as the modulation code is sometimes selected based on the channel response or properties of channel 122. The channel may, for example, be a wireless communication channel or may be storage media (such as Flash or disk drive) on which information is stored and later retrieved. Performance of the modulation code therefore relies upon the specific sequence of data output by modulation encoder 102 being the same sequence that is actually sent over the air or written to storage media. If some other sequence is sent over the air or is written to storage media, the modulation code may perform non-optimally. Using multiple interleavers (one embodiment of which is shown in this figure) helps a LDPC code (for example) improving performance. A single interleaver pair (i.e., one in the transmitter/write controller and one in the receiver/read controller) can achieve the performance but two interleaver pairs (e.g., 104 and 114, as well as 108 and 118), is because using a single interleaver pair would destroy the modulation constraint imposed on user data by modulation encoder 102. And, by using two interleaver pairs, it is ensured that a common portion maintains the modulation constraint.

Figure 2:
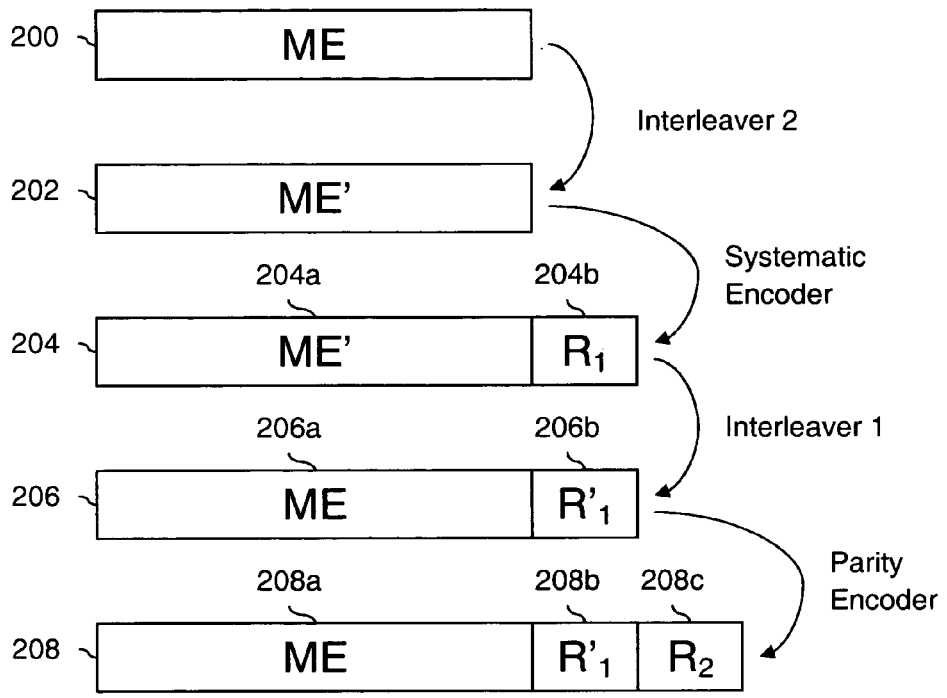
FIG. 2 is a diagram showing an embodiment of data processed by a transmitter or a write processor.

FIG. 2 is a diagram showing an embodiment of data processed by a transmitter or a write processor. In the example shown, the data is processed by device 100*a* shown in FIG. 1C. In the example, data 200 (modulation encoded data) is interleaved by interleaver 2, resulting in data 202. For example, data 200 is passed between modulation encoder 102 and interleaver 2 (104) in FIG. 1C. Data 202 is the same length as data 200 since interleaving does not introduce extra data. Data 202 is an example of data passed between interleaver 2 (104) and systematic encoder 106 in FIG. 1C.

Data 202 is processed by a systematic encoder, resulting in data 204 which includes portions 204*a* and 204*b*. Portion 204*a* is the same length as data 202 and contains the same information (in the same order) as data 202; portion 204*b* is the parity symbols added by the systematic encoder. In this example, systematic encoder duplicates the input data as the first portion of data 204. In some other embodiments, the input data is embedded in the end of the output.

Data 204 is an example of data passed between systematic encoder 106 and interleaver 1 (108) in FIG. 1C. The resulting interleaved data is data 206, which includes portions 206*a* and 206*b*. Interleaver 1 performs the inverse of interleaver 2 at least for the common portion so portion 206*a* is the same length and is in the same sequence as data 200 (input to interleaver 2). Portion 204*b* is interleaved and results in an interleaved portion 206*b*. The length of data 206 is the same as that of data 204.

Figure 3:
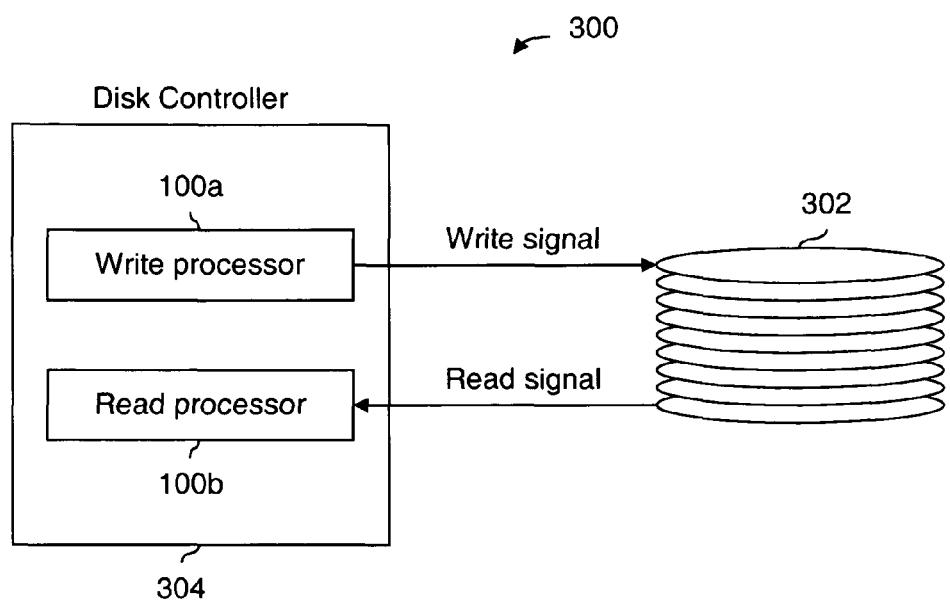
FIG. 3 is a system diagram illustrating an embodiment of a disk drive system that includes a read and write processor, each with two interleavers.

FIG. 3 is a system diagram illustrating an embodiment of a disk drive system that includes a read and write processor, each with two interleavers. In the example shown, disk drive system 300 includes disk media 302 and disk controller 304. Disk controller 304 includes write processor 100*a* and read processor 100*b*, which send and receive (respectively) write data and read data to and from disk media 302.

Figure 4:
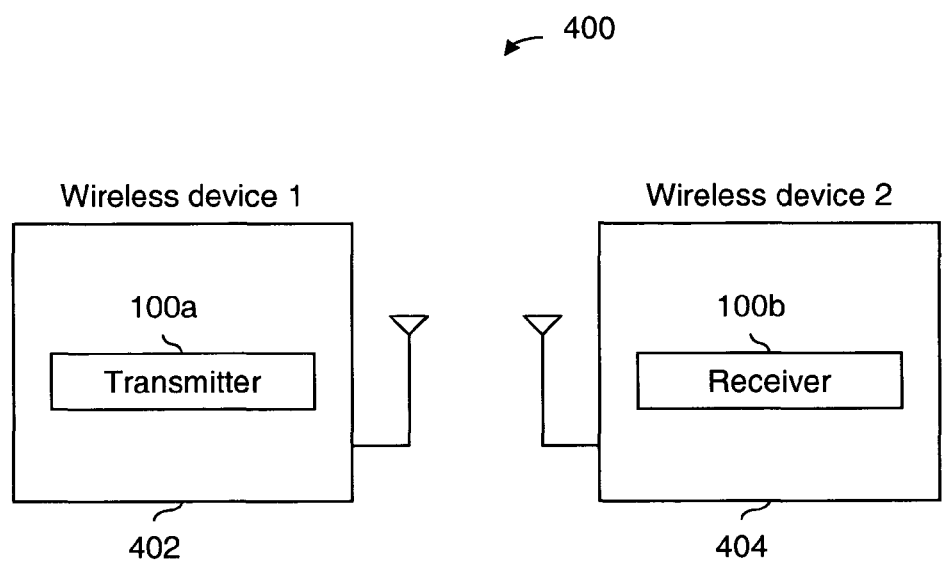
FIG. 4 is a system diagram illustrating an embodiment of a wireless system.

FIG. 4 is a system diagram illustrating an embodiment of a wireless system. In the example shown, system 400 includes wireless device 1 (402) and wireless device 2 (404). The wireless devices shown communicate over a wireless channel and have radios, antenna, and other components for transmitting and receiving signals over a wireless channel. Wireless device 1 (402) includes transmitter 100*a* and wireless device 2 (404) includes receiver 100*b*. In some embodiments, both wireless devices shown have transmit and receive capabilities. In some such embodiments, devices 402 and 404 each include transmitter 100*a* and receiver 100*b* (sometimes referred to as a transceiver).

In some applications there are two systematic codes, concatenated. The following figure shows an embodiment of system that can be used in such applications.

Figure 5:
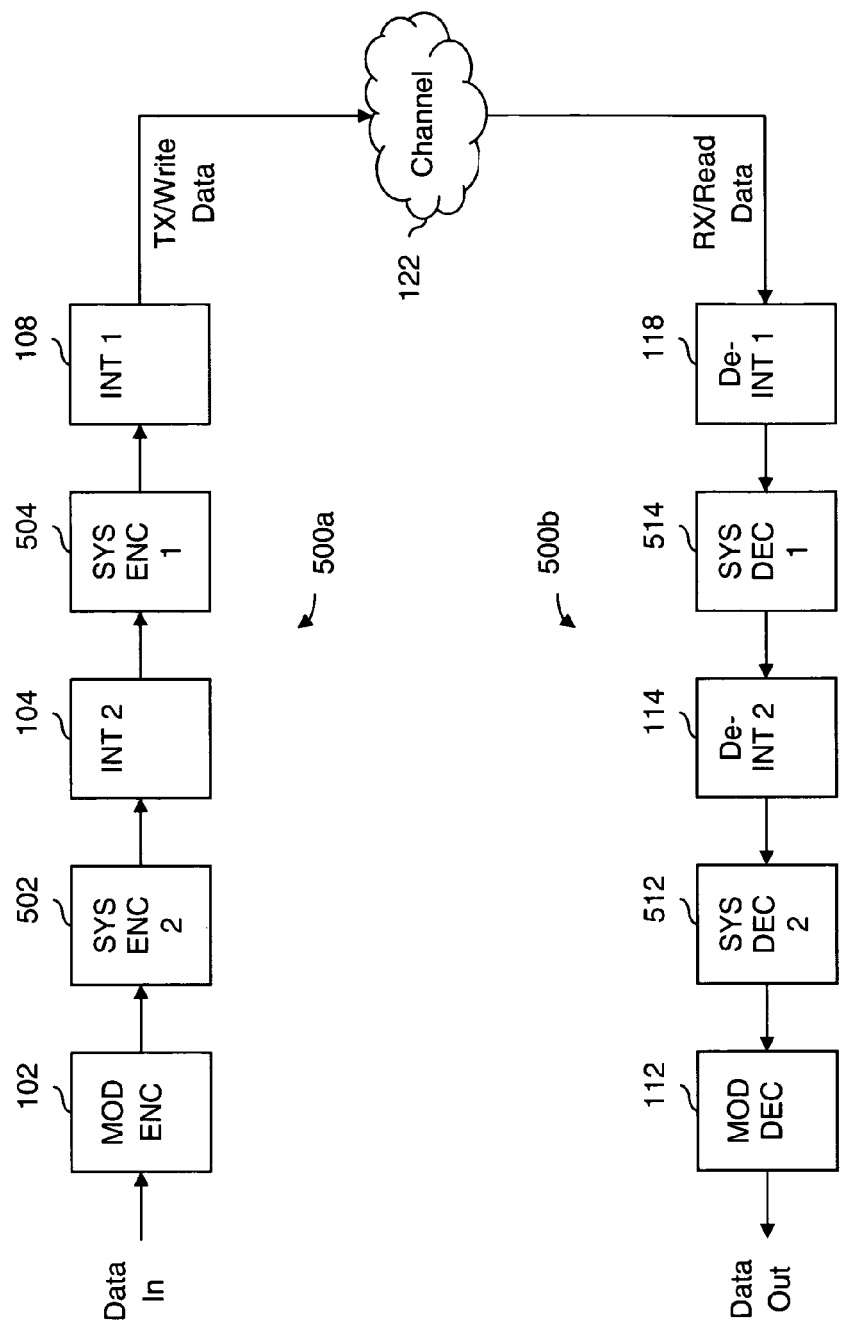
FIG. 5 is a system diagram showing an embodiment of a transmitter and a receiver, each with two interleavers, for applications with multiple systematic codes.

FIG. 5 is a system diagram showing an embodiment of a transmitter and a receiver, each with two interleavers, for applications with multiple systematic codes. The example of FIG. 5 is similar to that shown in FIG. 1C and corresponding components have the same reference number.

In the example shown, there are two systematic codes concatenated. In some embodiments both the outer code and the inner code are error correction codes. In one example, the outer code is selected for its ability to correct burst errors (e.g., a RS code) and the inner code is selected for its ability to correct random errors (e.g., an LDPC code). With respect to the components shown in this example, systematic encoder and decoder 2 (502 and 512) are the inner code and in one example perform RS coding; systematic encoder and decoder 1 (504 and 514) are the outer code and in one example perform LDPC coding.

In this example, the system shown has another advantage besides keeping the modulation constraints. Again, interleaver and de-interleaver 108 and 118 help to convert burst errors into random single errors in order to improve the performance by systematic encoder and decoder 504 and 514 (e.g., an LDPC code). However, interleaver and de-interleaver 108 and 118 used by themselves not only destroy modulation constraints imposed by modulation encoder 102, but also largely degrades the error correction performance of systematic encoder and decoder 502 and 512, say RS codes, because RS codes (as an example) perform better on correcting burst errors. Adding another interleaver pair 104 and 114, therefore, not only keeps the modulation constraints, but also maintains the error correction performance of 502 and 512.

Figure 6:
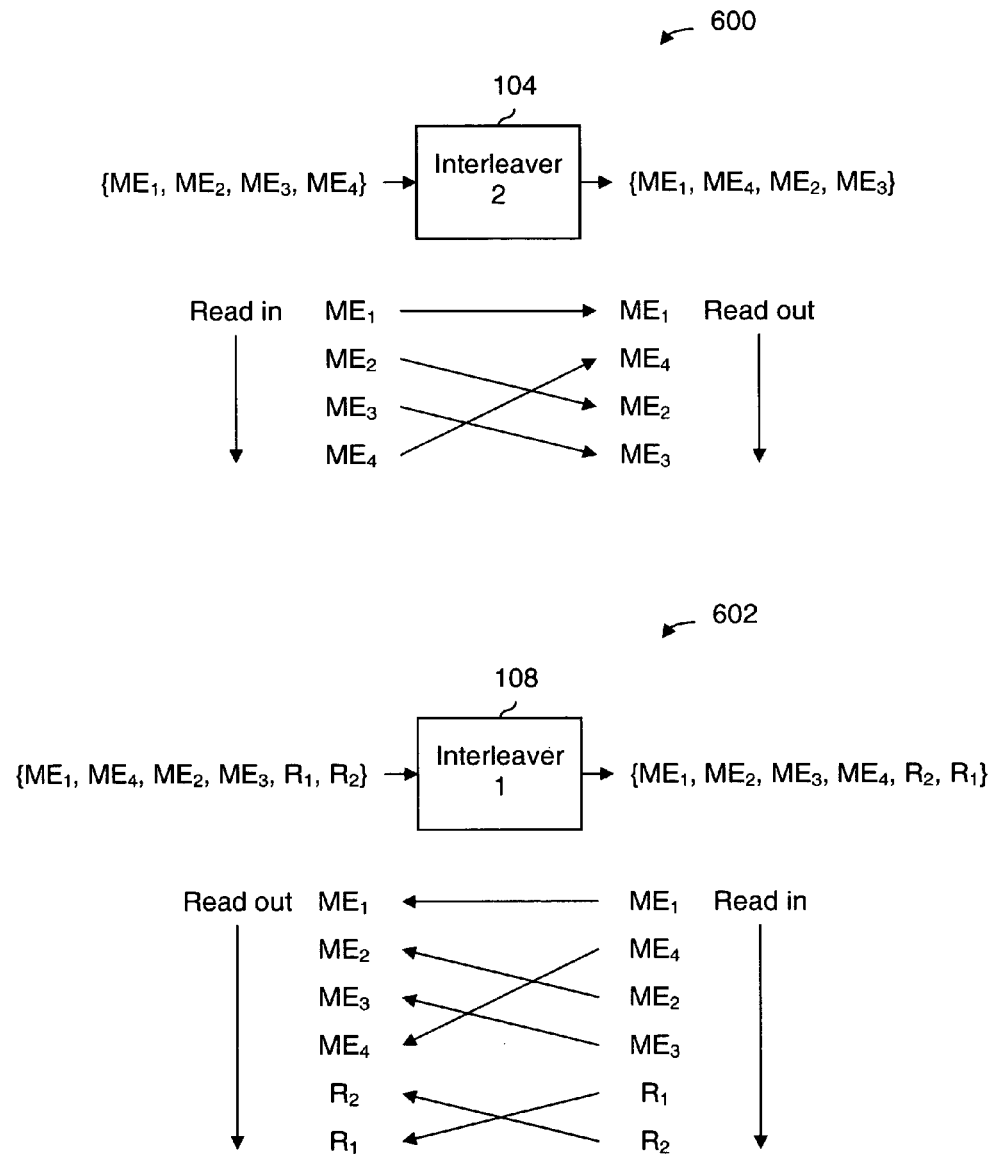
FIG. 6 is a diagram showing an embodiment of reordering performed by interleavers in a transmitter or write processor.

FIG. 6 is a diagram showing an embodiment of reordering performed by interleavers in a transmitter or write processor. In the example shown, the reorderings are performed by interleavers 1 and 2 (108 and 104, respectively) in FIGS. 1C and 5. In some other embodiments, interleavers perform some other reordering.

In this example, interleaver 2 (104) has a length of 4 and the data sequence {ME1, ME2, ME3, ME4} is received. The input data is received from modulation encoder and is modulation encoded. The sequence is reordered and the output sequence is {ME1, ME4, ME2, ME3}.

Interleaver 1 (108) has a length of 6 and receives an input sequence of {ME1, ME4, ME2, ME3, R1, R2}. For example, systematic encoder 106 from FIG. 1C inserts two pieces of redundant information: R1 and R2. In this example, the common portion shared by interleavers 1 and 2 consists of {ME1, ME4, ME2, ME3}. This portion is reordered so that the inverse operation is performed and the original sequence is obtained at least for this common portion. The portion which is not common can be reordered in any manner. In this example, the sequence {ME1, ME2, ME3, ME4, R2, R1} is output.

Figure 7:
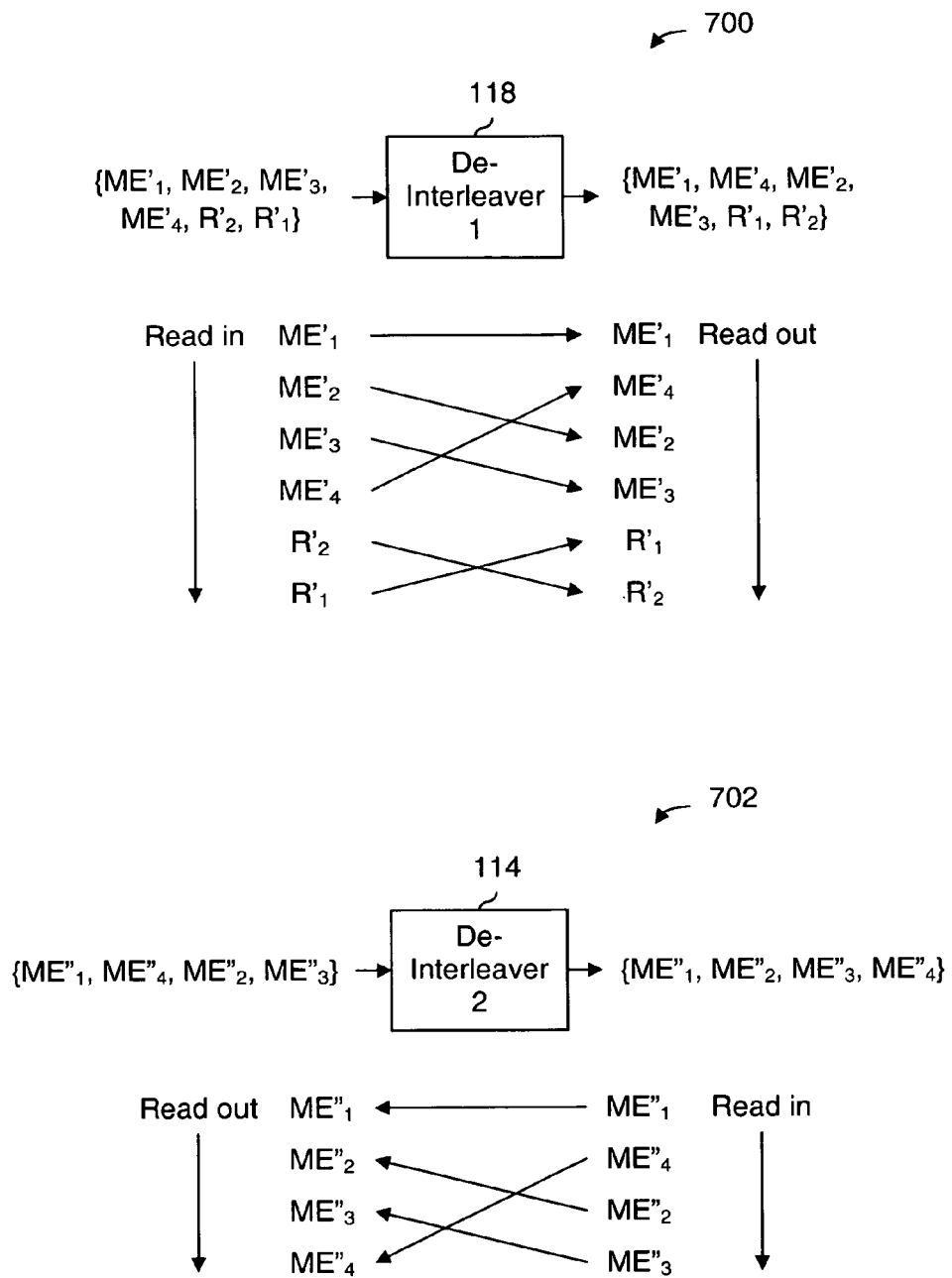
FIG. 7 is a diagram showing an embodiment of reordering performed by de-interleavers in a receiver or read processor.

FIG. 7 is a diagram showing an embodiment of reordering performed by de-interleavers in a receiver or read processor. In the example shown, the reordering is performed by de-interleavers 1 and 2 (118 and 114, respectively) from FIGS. 1C and 5. In some other embodiments, de-interleavers perform some other reordering.

In this example, the channel may have affected the transmitted or written signal and so the input sequence passed to de-interleaver 1 (118) is {ME'1, ME'2, ME'3, ME'4, R'2, R'1}, where ME'1=ME1+noise/error, ME'2=ME2+noise/error, etc. The sequence output by de-interleaver 1 (118) is {ME'1, ME'4, ME'2, ME'3, R'1, R'2}. This sequence is then processed by a systematic decoder (e.g., 514 in FIG. 5). As a result of the decoding, some or all of the sequence may be adjusted by the systematic decoder (e.g., based on the parity symbols, R'1 and R'2) and the parity symbols are removed. The sequence output by a systematic decoder is {ME"1, ME"4, ME"2, ME"3} where the " indicates the data has been processed by a systematic decoder.

De-interleaver 2 (114) receives the sequence {ME"1, ME"4, ME"2, ME"3} and outputs the sequence {ME"1, ME"2, ME"3, ME"4}.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for processing data, comprising:
    a modulation encoder configured to perform modulation encoding to obtain constrained data, wherein the constrained data satisfies a modulation constraint associated with limiting a number of consecutive events to a maximum number of consecutive events;
    a first interleaver configured to interleave using a first interleaving mapping to obtain first interleaved data;
    a systematic encoder configured to systematically encode the first interleaved data to obtain systematically encoded data; and
    a second interleaver configured to interleave the systematically encoded data using a second interleaving mapping to obtain second interleaved data, wherein:
        the second interleaved data includes a copy of the constrained data in the same sequence and having the same values as the constrained data; and
        the portion of the second interleaved data that includes the copy of the constrained data satisfies the modulation constraint associated with limiting the number of consecutive events to the maximum number of consecutive events.

2. The system of claim 1, wherein the system further comprises a storage interface configured to write to a storage device.

3. The system of claim 1, wherein the system further comprises an antenna configured to transmit a signal on a wireless channel.

4. The system of claim 1, wherein the systematic encoder is configured to perform error correction encoding.

5. The system of claim 4, wherein the error correction encoding includes at least one of the following: a Reed-Solomon (RS) code, a Bose-Chaudhuri-Hocquenghem (BCH) code, a low-density parity-check (LDPC) code, a convolutional code, or a turbo code.

6. The system of claim 1 further comprising a second systematic encoder configured to systematically encode the constrained data using a second systemic code to generate second systematically encoded data, wherein:
    the first interleaver receives as input the second systematically encoded data; and
    the second systematically encoded data includes a copy of the constrained data in the same sequence as the constrained data.

7. The system of claim 6, wherein the second systematic encoder is configured to perform error correction encoding.

8. The system of claim 7, wherein the error correction encoding performed by the second systematic encoder includes at least one of the following: a Reed-Solomon (RS) code, a Bose-Chaudhuri-Hocquenghem (BCH) code, a low-density parity-check (LDPC) code, a convolutional code, or a turbo code.

9. The system of claim 1 further comprising a parity encoder configured to parity encode the second interleaved data to obtain parity encoded data, wherein the parity encoded data includes a copy of the constrained data in the same sequence as the constrained data.

10. A method for processing data, comprising:
    using a processor to perform modulation encoding to obtain constrained data, wherein the constrained data satisfies a modulation constraint associated with limiting a number of consecutive events to a maximum number of consecutive events;
    interleaving, using the processor, using a first interleaving mapping to obtain first interleaved data;
    systematically encoding, using the processor, the first interleaved data to obtain systematically encoded data; and
    interleaving, using the processor, the systematically encoded data using a second interleaving mapping to obtain second interleaved data, wherein:
        the second interleaved data includes a copy of the constrained data in the same sequence and having the same values as the constrained data; and
        the portion of the second interleaved data that includes the copy of the constrained data satisfies the modulation constraint associated with limiting the number of consecutive events to the maximum number of consecutive events.

11. The method of claim 10, further comprising writing to a storage device.

12. The method of claim 10, further comprising transmitting a signal on a wireless channel.

13. The method of claim 10, wherein systematically encoding includes performing error correction encoding.

14. The method of claim 13, wherein the error correction encoding includes at least one of the following: a Reed-Solomon (RS) code, a Bose-Chaudhuri-Hocquenghem (BCH) code, a low-density parity-check (LDPC) code, a convolutional code, or a turbo code.

15. The method of claim 10, further comprising systematically encoding the constrained data using a second systemic code to generate second systematically encoded data, wherein:
    the second systematically encoded data is input to the interleaving which uses the first interleaving mapping; and
    the second systematically encoded data includes a copy of the constrained data in the same sequence as the constrained data.

16. The method of claim 15, wherein systematically encoding using the second systemic code includes performing error correction encoding.

17. The method of claim 16, wherein the error correction encoding includes at least one of the following: a Reed-Solomon (RS) code, a Bose-Chaudhuri-Hocquenghem (BCH) code, a low-density parity-check (LDPC) code, a convolutional code, or a turbo code.

18. The method of claim 10, further comprising parity encoding the second interleaved data to obtain parity encoded data, wherein the parity encoded data includes a copy of the constrained data in the same sequence as the constrained data.

19. A computer program product for processing data, the computer program product being embodied in a "non-transitory" tangible computer readable storage medium and comprising computer instructions for:
    performing modulation encoding to obtain constrained data, wherein the constrained data satisfies a modulation constraint associated with limiting a number of consecutive events to a maximum number of consecutive events;

interleaving using a first interleaving mapping to obtain first interleaved data;

systematically encoding the first interleaved data to obtain systematically encoded data; and interleaving the systematically encoded data using a second interleaving mapping to obtain second interleaved data, wherein:

the second interleaved data includes a copy of the constrained data in the same sequence and having the same values as the constrained data; and the portion of the second interleaved data that includes the copy of the constrained data satisfies the modulation constraint associated with limiting the number of consecutive events to the maximum number of consecutive events.

20. The computer program product of claim 19, wherein the computer instructions for systematically encoding include computer instructions for performing error correction encoding.

21. The computer program product of claim 20, wherein the error correction encoding includes at least one of the following: a Reed-Solomon (RS) code, a Bose-Chaudhuri-Hocquenghem (BCH) code, a low-density parity-check (LDPC) code, a convolutional code, or a turbo code.

22. The computer program product of claim 19, further comprising computer instructions for systematically encoding the constrained data using a second systemic code to generate second systematically encoded data, wherein:

the second systematically encoded data is input to the interleaving which uses the first interleaving mapping; and the second systematically encoded data includes a copy of the constrained data in the same sequence as the constrained data.

23. The computer program product of claim 22, wherein the computer instructions for systematically encoding using the second systemic code includes computer instructions for performing error correction encoding.

24. The computer program product of claim 19, further comprising computer instructions for parity encoding the second interleaved data to obtain parity encoded data, wherein the parity encoded data includes a copy of the constrained data in the same sequence as the constrained data.

* * * * *